(12) United States Patent
To

(10) Patent No.: US 7,630,055 B2
(45) Date of Patent: Dec. 8, 2009

(54) EXPOSURE APPARATUS AND METHOD

(75) Inventor: Hiromitsu To, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/139,240

(22) Filed: Jun. 13, 2008

(65) Prior Publication Data

US 2009/0002651 A1    Jan. 1, 2009

(30) Foreign Application Priority Data

Jun. 29, 2007    (JP)    ............... 2007-172453

(51) Int. Cl.
*G03B 27/42* (2006.01)
*G03B 27/52* (2006.01)

(52) U.S. Cl. .......................... 355/53; 355/30
(58) Field of Classification Search ............ 355/30, 355/52, 55, 67–71; 250/548
See application file for complete search history.

(56) References Cited

U.S. PATENT DOCUMENTS

| | | | | |
|---|---|---|---|---|
| 6,496,257 B1 * | 12/2002 | Taniguchi et al. | ........ | 356/239.2 |
| 7,242,455 B2 * | 7/2007 | Nei et al. | ........ | 355/53 |
| 2007/0076197 A1 * | 4/2007 | Koga | ........ | 356/237.3 |
| 2007/0258072 A1 * | 11/2007 | Nagasaka et al. | ........ | 355/53 |

FOREIGN PATENT DOCUMENTS

| JP | 2005-019864 A | 1/2005 |
|---|---|---|
| JP | 2005-038874 A | 2/2005 |
| JP | 2005-116570 A | 4/2005 |
| JP | 2005-191557 A | 7/2005 |
| WO | WO 2005/022616 A1 | 3/2005 |

* cited by examiner

*Primary Examiner*—Hung Henry Nguyen
(74) *Attorney, Agent, or Firm*—Canon U.S.A., Inc., IP Division

(57) ABSTRACT

An apparatus projects a pattern formed on an original plate onto a substrate through a projection optical system and liquid in a state where a gap between the substrate and a face of the projection optical system is filled with liquid. The apparatus includes a movable substrate stage to hold the substrate and including at least a mark unit or a measurement unit having a light-receiving unit, a determination device to determine whether the liquid is attached to the mark unit or the measurement unit, and a liquid supply device to attach liquid to at least the mark unit or the measurement unit before the attached liquid is air-dried if liquid is determined to be attached to the mark unit or the measurement unit.

16 Claims, 13 Drawing Sheets

EXPOSURE APPARATUS AND METHOD

BACKGROUND OF THE INVENTION

1. Field of the Invention

The present invention relates to an exposure apparatus and a method for manufacturing a device including a fine pattern such as a semiconductor device or a liquid crystal display device. More particularly, the present invention relates to an exposure apparatus and a method using an immersion method for manufacturing a device including a fine pattern such as a semiconductor device or a liquid crystal display device.

2. Description of the Related Art

A reduced projection exposure apparatus which transfers a pattern formed on a mask onto a substrate coated with a photosensitive material by reduced projection is used in manufacturing a semiconductor device such as a large scale integrated circuit (LSI) or a very-large-scale integrated circuit (VLSI) which includes an extremely fine pattern. With advancement of highly-integrated semiconductor device, a demand for a finer pattern is increasing. In order to meet such a demand, resist process as well as an exposure apparatus which is capable of producing a finer pattern have been developed.

Generally, two methods are used in improving resolution of an exposure apparatus. One is shortening of exposure wavelength and the other is increasing of numerical aperture (NA) of a projection optical system. As for the exposure wavelength, a krypton fluoride (KrF) excimer laser beam with an oscillation wavelength of about 248 nm or an argon fluoride (ArF) excimer laser beam with an oscillation wavelength of about 193 nm is used in place of i-line light source with a wavelength of 365 nm. Further, a fluorine ($F_2$) excimer laser with an oscillation wavelength of about 157 nm is being developed.

On the other hand, as a different method for improving resolution, a projection exposure method using immersion method is receiving attention. Conventionally, a space between a final face (i.e. a light exiting surface of a lens (final lens) nearest the image side) of a projection optical system and a face of a substrate (for example, wafer) to be exposed with light is filled with gas. On the other hand, in a case of the immersion exposure method, this space is filled with liquid.

The immersion method can improve resolution even when a light source of the same wavelength as the conventional light source is used. For example, if a space between the projection optical system and the wafer is filled with pure water (having a refractive index of 1.44) and if a maximum incident angles of a light beam which forms an image on the wafer are the same in the immersion method and the conventional method, then resolution of the immersion method increases 1.44 times compared to the conventional method. This is equivalent to increasing the NA of the projection optical system of the conventional method by 1.44 times. Thus, the immersion method can achieve a resolution of NA of 1 or more which may not be possible to achieve by the conventional method.

The immersion method which fills a space between a final face of a projection optical system and a wafer face with liquid is discussed, for example, in Japanese Patent Application Laid-Open No. 2005-19864. The method discussed in Japanese Patent Application Laid-Open No. 2005-19864 is intended to reliably fill a gap between a final face of a projection optical system and a substrate with liquid in an exposure apparatus using the immersion method.

As illustrated in FIGS. 16A through 16C, the exposure apparatus includes a liquid supply nozzle 38 which is arranged in a first direction as seen from a periphery of a projection optical system 13. When a substrate stage on which a substrate W is mounted is moved in a second direction which is a direction opposite the first direction liquid 40 is supplied onto a surface of the substrate W through the liquid supply nozzle 38 in the direction of an arrow and a liquid film is formed on the surface. The liquid 40 is continuously supplied onto the surface of the substrate W through the liquid supply nozzle 38 so that the liquid film is continuously spread on the substrate W while the substrate W is moved. The liquid 40 is collected by a liquid collection nozzle 39. A plate (hereinafter referred to as a coplanar plate) is arranged to maintain the immersion area on the substrate stage at a height substantially the same as the substrate W.

Japanese Patent Application Laid-Open No. 2005-116570 discusses an exposure apparatus having a photodetector on a wafer stage and using an immersion method. The method discussed in Japanese Patent Application Laid-Open No. 2005-116570 aims at optimizing an exposure state based on a light-receiving result of the photodetector in order to realize the exposure apparatus which is capable of exposing with high precision. The exposure apparatus exposes a substrate with light by irradiating the substrate through a projection optical system and liquid. The substrate is arranged on an image plane side of the projection optical system. The exposure apparatus includes a photodetector configured to receive light which passes a slit plate of the projection optical system, and a temperature sensor configured to detect temperature of the liquid. The slit plate is arranged on the image plane side of the projection optical system. The liquid fills a space between the projection optical system and the slit plate. A detection result obtained by the photodetector and a measurement result obtained by the temperature sensor are used in calculating performance including image forming performance. Then, the performance information is reflected at the time of the exposure.

Japanese Patent Application Laid-Open No. 2005-191557 discusses a method for preventing liquid from remaining on a substrate table. The method is used in an immersion exposure apparatus which includes a substrate table configured to hold a substrate. A plate member having a liquid-repellent flat surface is arranged replaceably on the substrate table. Further, a reference member having a liquid-repellent surface is replaceably arranged on the substrate plate. Polytetrafluoroethylene is used to give a liquid-repellency to the surfaces.

International Publication No. 2005/022616 discusses a method for removing liquid remaining in an immersion exposure apparatus. International Publication No. 2005/022616 discusses problems of liquid dripping from a liquid supply- and-collection nozzle of a projection optical system, watermarks or stains of residual water, scattering of residual water on a reference mark, and degraded precision of an interferometer due to liquid attached to an interferometer reflection mirror when collection of the liquid is insufficient. In order to solve these problems, International Publication No. 2005/022616 discusses a liquid removing mechanism for blowing gas which is capable of changing a blow speed of gas, a vibrating apparatus which removes residual water by vibration, and gutters or eaves which are arranged on a wafer stage to prevent liquid from attaching thereto. Further, blowing gas and collecting residual water from a drain unit is also discussed as a method for removing residual water on the reference mark.

Japanese Patent Application Laid-Open No. 2005-38874 discusses a device having a plurality of wafer stages which is used in an immersion exposure apparatus. According to the device, a stage can be moved in a non-contact state between movable bodies with enhanced throughput. It is described that the device can be adapted to an immersion exposure apparatus. Two stages which are movable in a two-dimensional plane are supported and driven in the non-contact state with respect to first and second movable bodies. The stages can be micro-driven in two axial directions which are perpendicular to each other in the two-dimensional plane with respect to each movable body. The stage is moved from one movable body to the other while the movable bodies are in proximity to each other. When the stage moves from one movable body to the other, since the stages can be micro-driven while the movable bodies are in proximity to each other, the stages can be moved between the movable bodies in a non-contact state and with enhanced throughput.

Arranging a reference member or a reference mark on a wafer stage is discussed in Japanese Patent Application Laid-Open No. 2005-116570, Japanese Patent Application Laid-Open No. 2005-191557, and International Publication No. 2005/022616. A liquid-repellent coplanar plate arranged in a periphery of a substrate and arranged at a substantially same height as the substrate is discussed in Japanese Patent Application Laid-Open No. 2005-191557. A method used for removing residual water on a reference mark is discussed in WO2005/022616. Further, a method used for removing residual water on a surface of an interferometer mirror is discussed in International Publication No. 2005/022616. An immersion exposure apparatus including two wafer stages is discussed in Japanese Patent Application Laid-Open No.2005-38874. However, When the liquid is removed, a drying process by blowing gas needs to be performed or time is taken for transferring liquid which reduces throughput. The present invention aims at solving the above-described problems in the conventional techniques.

SUMMARY OF THE INVENTION

An embodiment of the present invention is directed to an exposure apparatus and a method for manufacturing a device including a fine pattern.

According to an aspect of the present invention, an exposure apparatus is provided to project a pattern formed on an original plate onto a substrate through a projection optical system and liquid in a state where a gap between the substrate and a face of the projection optical system is filled with liquid. The exposure apparatus includes a movable substrate stage configured to hold the substrate and including at least a mark unit or a measurement unit having a light-receiving unit, a determination device configured to determine whether the liquid is attached to at least the mark unit or the measurement unit, and a liquid supply device configured to attach liquid to at least the mark unit or the measurement unit before the attached liquid is air-dried if the determination device determines that the liquid is attached to at least one of the mark unit and the measurement unit.

According to another aspect of the present invention, a method is provided for projecting a pattern formed on an original plate onto a substrate through a projection optical system and liquid in a state where the substrate is mounted onto a movable substrate stage comprising at least a mark unit or a measurement unit and a gap between the substrate and a face of the projection optical system is filled with the liquid. The method includes determining whether liquid is attached to at least the mark unit or the measurement unit, and attaching liquid to at least the mark unit or the measurement unit before the attached liquid is air-dried if liquid is determined to be attached to at least one of the mark unit and the measurement unit.

According to an exemplary embodiments the present invention, if the liquid from an immersion unit is attached to a mark unit or a measurement unit arranged on a substrate stage, additional liquid from the immersion unit or other liquid is attached to the mark unit or the measurement unit before the attached liquid is air-dried. In this way, after the liquid is attached to the mark unit or the measurement unit, the liquid-attached portion is maintained consistently in a wet state so that a watermark is prevented from forming on the mark unit or the measurement unit.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Figure 1:
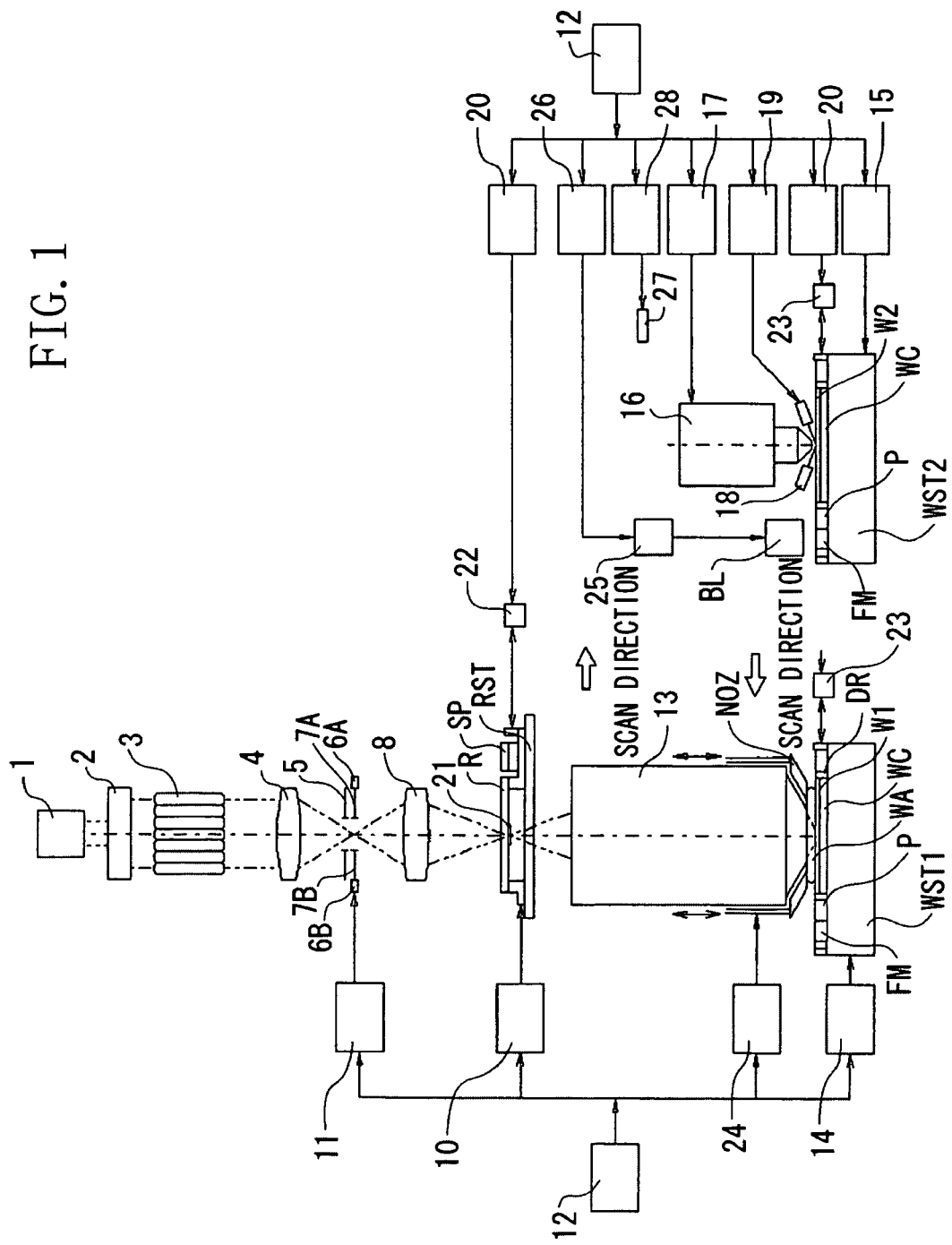
FIG. 1 illustrates a configuration of an immersion exposure apparatus according to an exemplary embodiment of the present invention.
Figure 2:
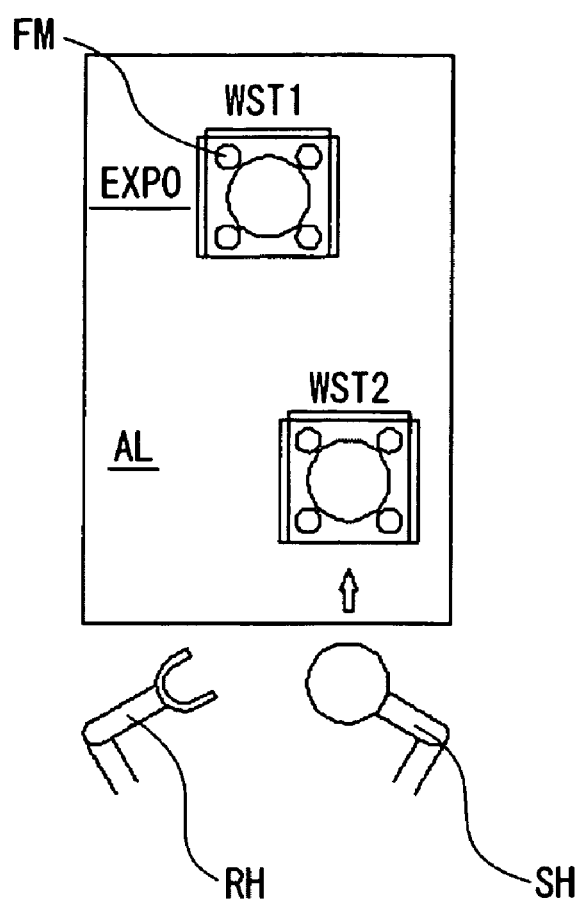
FIG. 2 is a top view of a wafer stage of the immersion exposure apparatus illustrated in FIG. 1.

Various exemplary embodiments, features, and aspects of the invention will be described in detail below with reference to the drawings.

According to an exemplary embodiment of the present invention, an exposure apparatus configured to project and transfer a pattern formed on an original plate onto a substrate through a liquid includes a movable substrate stage configured to hold the substrate. The substrate is mounted on the substrate stage. Further, at least a mark unit for measuring exposure data or a measurement unit including a light-receiving unit is arranged on the substrate stage. The mark unit includes, for example, a reference mark used as a reference when the substrate is aligned with the original plate. The measurement unit includes, for example, a light-receiving unit of a photodetector configured to measure an amount of exposure on the substrate or a mark for measuring image forming performance or a focus position of a projection optical system and a light-receiving unit configured to receive an image of the mark. Further, a plate arranged at a substantially same height as the substrate, an interferometer reflection mirror for position measurement, and a light quantity detector (hemispherical lens for condensing) are arranged on the substrate stage.

A liquid removing mechanism configured to remove liquid attached to at least one of the mark unit and the measurement unit by blowing gas to the liquid is included in the exposure apparatus. In addition, a drain unit and a drain mechanism for draining liquid on a periphery of the substrate, the mark unit, or the measurement unit is included in the exposure apparatus. Furthermore, a liquid removing mechanism configured to remove liquid by blowing gas to the liquid attached to the substrate, the mark unit or the measurement unit and by draining the liquid from the drain unit is included in the exposure apparatus.

A part of at least one of the mark unit and the measurement unit, and especially an area other than an area exposed with light is liquid-repellent. The liquid removing mechanism can remove the liquid attached to an area of the mark unit or the measurement unit which is exposed with light and not liquid-repellent. According to a position of the substrate stage, the exposure apparatus can determine whether the area of the mark unit or the measurement unit which is not liquid-repellent has passed through the liquid in an immersion portion.

If the liquid in the immersion portion is attached to the area of the mark unit or the measurement unit which is not liquid-repellent, the substrate stage can be moved so that liquid can be attached to the area of the mark unit or the measurement unit which is not liquid-repellent before the liquid attached to the area of the mark unit or the measurement unit is air-dried. Alternatively, the liquid may be supplied from a second liquid supply unit different from a first liquid supply unit configured to supply the liquid into a gap between the substrate and a final face of the projection optical system to the area of at least one of the mark unit and the measurement unit which is not liquid-repellent. The exposure apparatus may include both the configuration adapted to attach the liquid to the area of the mark unit or the measurement unit which is not liquid-repellent by moving the substrate stage and the configuration adapted to supply the liquid from the second liquid supply unit.

The liquid attached to the area of the mark unit or the measurement unit which is not liquid-repellent is removed when the exposure apparatus is stopped or when at least one of the mark unit and the measurement unit is used in a dry state. The liquid removing mechanism is provided for each of the wafer, the mark unit or the measurement unit, the coplanar plate, and the interferometer reflection mirror. If a plurality of mark units or measurement units, and interferometer reflection mirrors are included in the exposure apparatus, a plurality of liquid removing mechanisms will be provided for each of such units.

According to the above-described configuration, by moving the substrate stage so that the liquid from the immersion unit is attached to the area of the mark unit or the measurement unit which is not liquid-repellent before the liquid attached thereto is dried, the area of the mark unit or the measurement unit which is not liquid-repellent can maintain a wet state consistently. Alternatively, by supplying the liquid from a liquid supply port, the area of the mark unit or the measurement unit which is not liquid-repellent can maintain the wet state consistently. In this way, generation of a watermark caused by air-drying of the liquid attached to the area of the mark unit or the measurement unit which is not liquid-repellent can be prevented.

Further, if the liquid contacts the area of the mark unit or the measurement unit which is not liquid-repellent during exposure, the liquid is not removed and the wet state will be maintained. On the other hand, when the exposure apparatus is in an idle state, by attaching the liquid to the mark unit or the measurement unit before the liquid remaining in the area of the mark unit or the measurement unit which is not liquid-repellent dries, time necessary in removing liquid during exposure can be reduced and reduction in throughput can be prevented. Further, the liquid removing mechanism is provided for each of the wafer, the mark unit or the measurement unit, the coplanar plate, and the interferometer reflection mirror.

An exemplary embodiment of the present invention will now be described referring to FIG. 1.

FIG. 1 illustrates a configuration of an immersion exposure apparatus according to the exemplary embodiment of the present invention. In FIG. 1, two wafer stages WSTs, a first wafer stage WST1 and a second wafer stage WST2 are provided. The wafer stage WST includes an exposure area exposed by a projection optical system 13 and a measurement area where a wafer W is detected by an alignment sensor 16 and a detection system 18. The exposure apparatus of the present exemplary embodiment has a two-stage configuration.

In FIG. 1, a reticle R is illuminated at uniform luminance on an illumination area 21 having a rectangular slit shape by a light source 1 and an illumination optical system including an illumination light shaping optical system 2 through a relay lens system 8. A circuit pattern image of the reticle R in the slit-shaped illumination area 21 is transferred onto the wafer W via the projection optical system 13.

A pulse light source such as an $F_2$ excimer laser, an ArF excimer laser, or a KrF excimer laser can be used as the light source 1. Further, a pulse light source such as a combination of a metal vapor laser light source or a YAG laser and a harmonic generation apparatus, and a continuous emission light source such as a combination of a mercury lamp and an elliptic reflection mirror may be used.

If the light source is a pulse light source, the exposure can be turned on or off by controlling power supplied from a power supply apparatus of the pulse light source. If the light source is a continuous emission light source, the exposure can be turned on or off using a shutter in the illumination light shaping optical system 2. According to the present exemplary embodiment, since a movable blind (adjustable field stop) 7 is provided as described below, the exposure can be turned on or off by opening or closing the movable blind 7.

In FIG. 1, the illumination light from the light source 1 is incident on a fly-eye lens 3 with a light flux diameter adjusted to a predetermined size by the illumination light shaping optical system 2. A great number of secondary light sources are formed on an exit surface of the fly-eye lens 3. Illumination light from these secondary light sources is condensed by a condenser lens 4 and incident on the movable blind (adjustable field stop) 7 through a fixed field stop 5. Although the field stop 5 is arranged on the side of the condenser lens 4 of the movable blind 7 in FIG. 1, it may be arranged on the side of the relay lens system 8.

An aperture unit having a rectangular slit shape is formed in the field stop 5. A light flux passing through the field stop 5 is shaped into a light flux having a rectangular slit-shaped cross section and incident on the relay lens system 8. A longitudinal direction of the slit is perpendicular to the sheet surface. The relay lens system 8 conjugates the movable blind 7 with a pattern-formed face of the reticle R.

The movable blind 7 includes two blades (light-blocking plates) 7A and 7B configured to define a width in a scan direction (X-direction) and two blades (not shown) configured to define a width in a non-scan direction perpendicular to the scan direction which are described below. The blades 7A and 7B configured to define the width in the scan direction are supported by drive units 6A and 6B can move independently in the scan direction. Each of the two blades (not shown) configured to define the width in the non-scan direction is also supported by a drive unit so that it can be independently driven. According to the present exemplary embodiment, illumination light is irradiated onto a desired exposure area which is in the slit-shaped illumination area 21 on the reticle R set by the fixed field stop 5, and further set by the movable blind 7.

The relay lens system 8 is a double telecentric optical system and telecentricity is maintained on the slit-shaped illumination area 21 on the reticle R. The reticle R is held by a reticle stage RST. A position of the reticle stage RST is detected by an interferometer 22 and an interferometer control unit 20. The reticle stage RST is driven by a reticle stage drive unit 10. A reference plate SP on which a reference mark is arranged is included in the reticle stage RST. The reference mark arranged on the reference plate SP is used for calibration of the apparatus.

A TTL detection system (not shown) is set between the relay lens system 8 and the reticle R. The TTL detection system is configured to measure a relative position between the reference mark on the reference plate SP or the mark on the reticle and the wafer W or a reference mark unit FM. A circuit pattern image formed in the slit-shaped illumination area 21 and on the reticle R which is defined by the movable blind 7 is projected onto the wafer W via the projection optical system 13 and exposed.

In a two-dimensional plane perpendicular to an optical axis of the projection optical system 13, the scan direction of the reticle R with respect to the slit-shaped illumination area 21 is defined as +X direction (or X direction) and a direction parallel to the optical axis of the projection optical system 13 is defined as Z direction. In this case, the reticle stage RST is driven by the reticle stage drive unit 10 so that the reticle R is scanned in the scan direction (+X direction or X direction). Movements of the drive units 6A and 6B which drive the blades 7A and 7B and the drive unit for the non-scan direction are controlled by a movable blind control unit 11. Movements of the reticle stage drive unit 10 and the movable blind control unit 11 are controlled by a main control system 12 configured to control movements of the whole exposure apparatus.

The wafer W is conveyed by a wafer conveying apparatus (not shown) and held by vacuum suction by a wafer chuck WC provided on the wafer stage WST1 or the wafer stage WST2 (the second substrate stage). Each of the wafer stages WST1 and WST2 includes an XY stage configured to position the wafer W in a plane perpendicular to the optical axis of the projection optical system 13 and scan the wafer W in the +X or −X direction as well as a Z stage configured to position the wafer W in the Z direction. The wafer stages WST1 and WST2 and the wafers W1 and W2 are hereinafter described as the wafer stage WST and the wafer W unless otherwise specified.

The position of the wafer stage WST is detected by an interferometer 23. The interferometer 23 is controlled by the interferometer control unit 20. Although not illustrated in FIG. 1, the interferometer 23 is capable of detecting the wafer stage WST in the X-axis and the Y-axis directions as well as the rotation directions around the X-axis and the Y-axis. The reference mark unit FM which is used for calibration of the apparatus or alignment of the wafer is provided on the wafer stage WST. Further, although not illustrated in FIG. 1, a measurement unit capable of measuring image forming performance or luminance is arranged on the wafer stage WST.

In the periphery of the wafer W, the coplanar plate P is arranged at a substantially same height as the surface of the wafer W. The coplanar plate P is held by vacuum suction to the wafer stage WST. A drain unit DR which is connected to a drain mechanism (not shown) is provided in the periphery of the wafer W. A drain unit DRFM (not shown) which is connected to the drain mechanism is provided in the periphery of the reference mark unit FM. A liquid supply and collection unit NOZ is provided above the wafer W and on the image plane side of the projection optical system 13. The liquid supply and collection unit NOZ is connected to a supply unit (not shown) and a collection unit (not shown). The supply unit includes a liquid supply piping, a pump, a temperature control unit, and a filter. The collection unit includes a liquid collection piping, a pump, and a vapor/liquid separator. The supply and collection of liquid is controlled by a control unit 24 configured to control the supply unit and the collection unit.

An alignment sensor (detection system) 16 employing an off-axis method is arranged above the wafer W in the measurement area. An alignment mark on the wafer W is detected by the alignment sensor 16, processed by a control unit 17, and sent to the main control system 12. Further, a detection system (focus sensor) 18 configured to measure a height and a tilt direction of the wafer W is arranged above the wafer W. The detection system 18 includes an optical system employing a grazing incidence method. The height of the surface and the tilt of the wafer W are detected by the detection system 18, processed by a control unit 19, and sent to the main control system 12. The main control system 12 controls a positioning movement and a scanning movement of the wafer stage WST via wafer stage drive units 14 and 15.

In the exposure area, the main control system 12 controls the positioning movement and the scanning movement of the wafer stage WST via the wafer stage drive unit 14 based on measurement results obtained by the alignment sensor 16 and the detection system 18.

A hygrometer detection unit 27 which is controlled by a hygrometer control unit 28 is arranged in the measurement area. Humidity information obtained by the hygrometer detection unit 27 is sent to the main control system 12. The hygrometer detection unit 27 may be arranged on the exposure area or on both the exposure area and the measurement area. Temperature and humidity of a space where the wafer stage WST is located is controlled by an air-conditioning apparatus (not shown). A blow unit BL is provided above the wafer stage WST. Supply and collection of gas is performed by a blow piping unit 25 and humidity is controlled by a blow control unit 26. Although the hygrometer and the blow unit are located in the measurement area in FIG. 1, they may be arranged in the exposure area or both the measurement area and the exposure area.

When the circuit pattern image formed on the reticle R is transferred and exposed onto each shot area on the wafer W via the projection optical system 13 using the scanning and exposing method, the reticle R is scanned in −X direction or +X direction at a speed VR with respect to the slit-shaped illumination area 21 set by the field stop 5 illustrated in FIG. 1. The wafer W is scanned at a speed VW(=β·VR) in the +X direction or −X direction in synchronization with the scanning of the reticle R, wherein a projection magnification of the projection optical system 13 is β. In this way, the circuit pattern image of the reticle R is sequentially transferred onto the shot area on the wafer W.

FIGS. 2 through 6 illustrate top views of the wafer stage WST from when the wafer W is carried in to the wafer stage to when it is carried out. Supply and collection of the wafer W between a wafer conveying system (not shown) and the wafer stage WST is performed by a wafer carry-in unit SH and a wafer collection unit RH. In FIGS. 2 through 6, an exposure area EXPO is illustrated in the upper portion and a measurement area AL is illustrated in the lower portion.

The wafer exposure process will be described referring to FIGS. 2 through 6. First, in FIG. 2, an unexposed wafer W is carried onto the wafer stage WST2 by the wafer carry-in unit SH. Since a prealignment operation of the wafer W is the same as the conventional apparatus, description of the prealignment operation will be omitted. At the time, a wafer W being exposed or already exposed is held by the wafer stage WST1.

Figure 3:
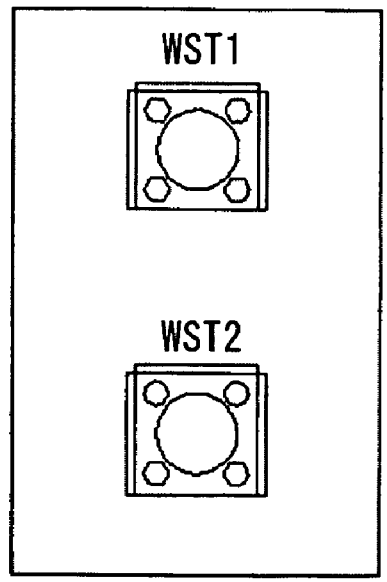
FIG. 3 is a top view of the wafer stage of the immersion exposure apparatus illustrated in FIG. 1.

Next, in FIG. 3, the wafer stage WST2 is moved from a wafer carry-in position to the measurement area AL. In FIG. 3, the wafer W is measured by the alignment sensor 16 (not shown) and the detection system 18 (not shown) in the measurement area AL.

Figure 4:
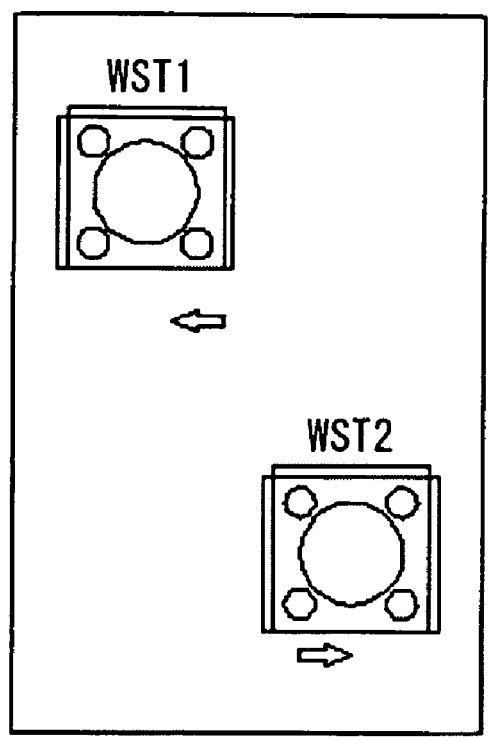
FIG. 4 is a top view of the wafer stage of the immersion exposure apparatus illustrated in FIG. 1.

Next, in FIG. 4, each of the wafer stages WST1 and WST2 is moved to a stage swap start position. Arrows in FIG. 4 indicate directions in which the wafer stages WST1 and WST2 move.

Figure 5:
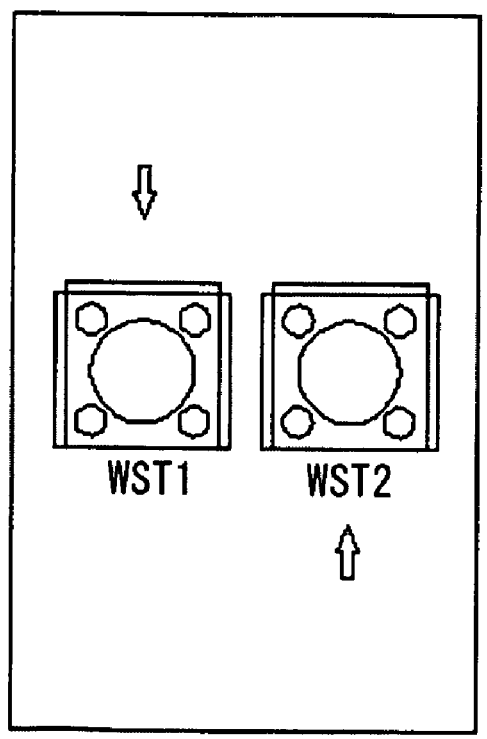
FIG. 5 is a top view of the wafer stage of the immersion exposure apparatus illustrated in FIG. 1.

Next, in FIG. 5, the wafer stages WST1 and WST2 perform the stage swap. FIG. 5 shows a position at which the wafer stages WST1 and WST2 pass each other.

Figure 6:
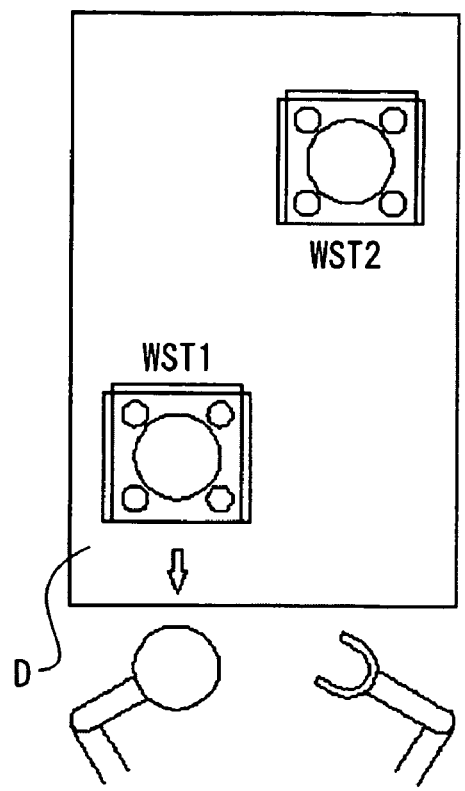
FIG. 6 is a top view of the wafer stage of the immersion exposure apparatus illustrated in FIG. 1.

Next, in FIG. 6, the wafer stage WST1 is moved to a wafer carry-out position D.

On the other hand, the wafer stage WST2 is moved to the exposure area EXPO. After the position of the wafer stage WST2 is measured, the exposure operation is started.

The wafer stage WST1 is moved to a wafer carry-in position and receives an unexposed wafer W from the wafer carry-in unit SH at the wafer carry-in position. Then the wafer stage WST1 is moved to the wafer carry-out position or the stage swap position. After then, the wafer stage WST1 is moved in a direction opposite the direction indicated by the arrow in FIG. 5 and the stage swap is performed.

When the exposure is finished, the wafer stage WST2 is moved to the stage swap position and the stage swap is performed. Then, the wafer stage WST2 is moved to the wafer carry-out position where the wafer W is collected by the wafer collection unit RH. After then, the wafer stage WST2 is moved to the wafer carry-in position illustrated in FIG. 2. Exposure of the wafer is performed by repeating these processes.

Figure 7:
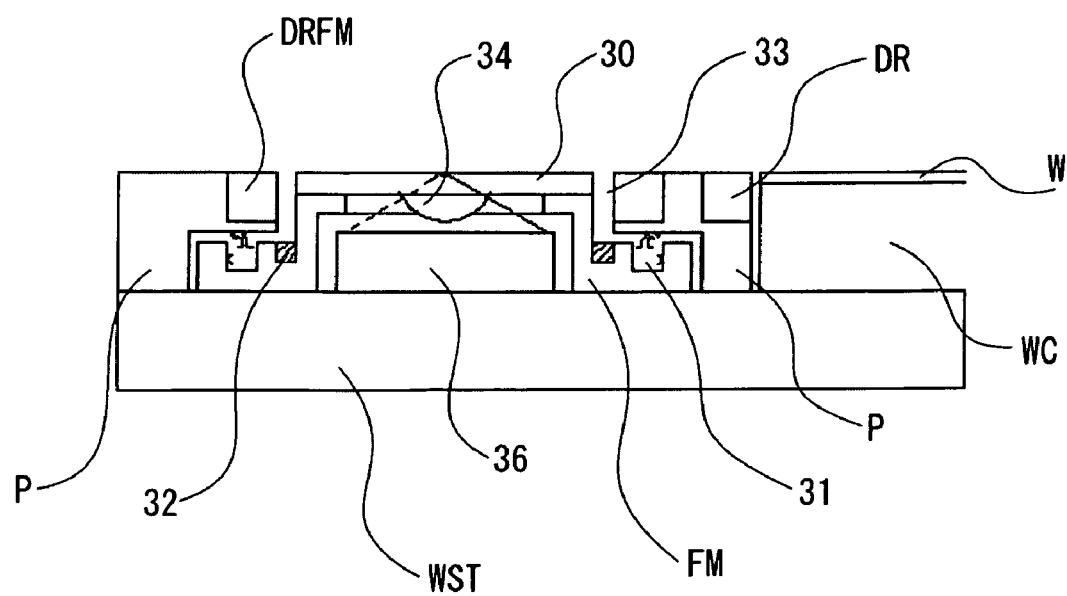
FIG. 7 illustrates a reference mark unit on the wafer stage of the immersion exposure apparatus illustrated in FIG. 1.

FIG. 7 is a cross-section view of the reference mark unit FM, the wafer W, and the wafer chuck WC. The wafer chuck WC is fixed onto the wafer stage WST by vacuum suction. The wafer W is fixed onto the wafer chuck WC by vacuum suction. The coplanar plate P is fixed onto the wafer chuck WC about a periphery of the wafer W by vacuum suction. The top surface of the coplanar plate P is at the same or substantially the same height as the surface of the wafer W. A drain unit DR is formed along a perimeter of the coplanar plate P on the wafer W side. The drain unit DR which has a porous structure and is connected to a drain mechanism by a piping (not shown).

A glass substrate 30 is provided at the upper portion of the reference mark unit FM on which the reference mark is formed. The glass substrate 30 is adhesively fixed to the wafer stage WST. A hemispherical lens 34 is fixed to the undersurface of the glass substrate 30 with optical contact bonding. A light quantity detector 36 which measures a quantity of light transmitted through the reference mark formed on the glass substrate 30 is arranged below the hemispherical lens 34. Since the hemispherical lens 34 is provided, the light quantity detector 36 can detect light beam of NA greater than or equal to 1. The drain unit DRFM is formed along the perimeter of the coplanar plate P around the reference mark unit FM. The drain unit DRFM which has a porous structure and is connected to the drain mechanism by a piping (not shown).

A portion between the reference mark unit FM and the coplanar plate P is sealed by a seal 31. Thus, even if the liquid enters a gap 33 between the reference mark unit FM and the coplanar plate P, the liquid will not seep into the wafer stage WST side and cause a failure. Further, a drain unit 32 is formed at the bottom of the gap 33 and connected to the drain mechanism (not shown). Thus even if the liquid enters the gap 33, the liquid can be drained.

Figure 8:
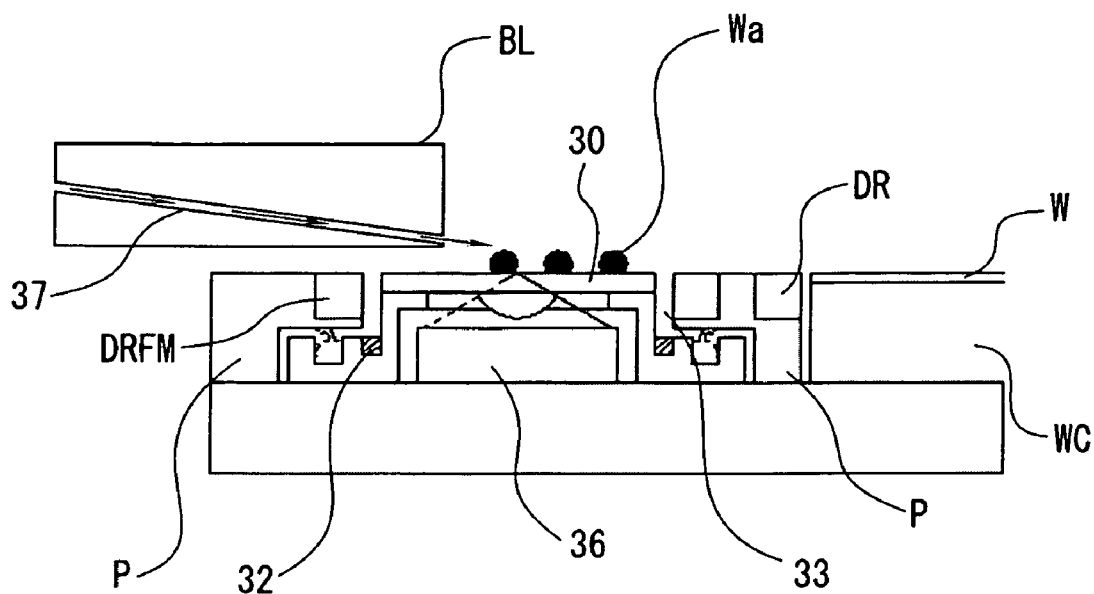
FIG. 8 illustrates a blow unit for the reference mark unit illustrated in FIG. 7.

FIG. 8 illustrates the blow unit BL included in the liquid removing mechanism. The blow unit BL in FIG. 8 is a blow unit for the reference mark unit. Descriptions about the blow units for the wafer W, the interferometer reflection mirror, and the coplanar plate are omitted, however, the liquid can be removed if a method similar to the one illustrated in FIG. 8 is used. Descriptions about components illustrated in FIG. 8 that are same as in FIG. 7 will be omitted. FIG. 8 illustrates a case where residual water Wa is on the glass substrate 30 of the reference mark unit FM. A gas supply unit 37 is included in the blow unit BL. Arrows in FIG. 8 show a flow of gas. The gas is blown to the residual water Wa from the blow unit BL. At this time, the wafer stage WST moves in a direction opposite the direction in which the gas is blown. The residual water Wa is moved to the gap 33 by the blow of the gas and drained from the drain unit DRFM.

An area other than the area exposed with light on the glass substrate 30 is treated with a water-repellent coating for measurement. Area other than the water repellent coated area is glass substrate and thus hydrophilic. Accordingly, water remains in the hydrophilic area which is the area other than the area with the water repellent coating. However, since the hydrophilic area is limited, the liquid can be removed by a blow of gas by the blow unit BL. Although FIG. 8 illustrates the blow unit for one reference mark, if a plurality of reference marks are used, a plurality of blow units BL will be arranged for each of the reference marks.

Next, management of the residual water Wa attached on the reference mark unit FM of the wafer stage WST1 will be described. In FIGS. 9 through 12, the exposure area EXPO is illustrated in the upper portion and the measurement area AL is illustrated in the lower portion. The main control system 12 determines whether the reference mark unit FM contacts liquid from an immersion unit WA during the exposure. If the reference mark unit FM contacts the liquid from the immersion unit WA, the main control system 12 controls the reference mark unit FM to maintain a wet state.

Figure 9:
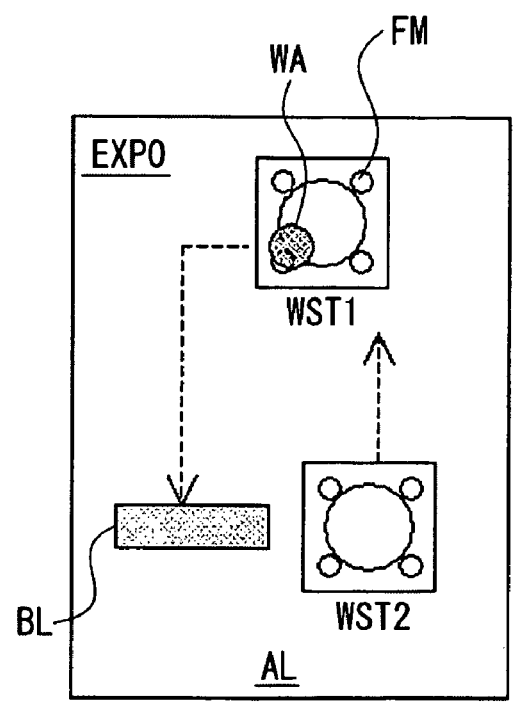
FIG. 9 is a top view of the wafer stage of the immersion exposure apparatus illustrated in FIG. 1 with residual water on the reference mark unit illustrated in FIG. 8.

In FIG. 9, after exposure is completed, the wafer stage WST1 whose reference mark unit FM contacted the liquid from the immersion unit WA in the exposure area EXPO during the exposure operation performs the stage swap and moves to the measurement area AL. During the exposure operation, if the reference mark unit FM contacts the liquid from the immersion unit WA in the exposure area EXPO before the residual water Wa on the reference mark unit FM is dried, since the reference mark unit FM is continuously kept wet by the liquid from the immersion unit WA, the exposure operation is continued without wetting the reference mark unit FM.

Figure 10:
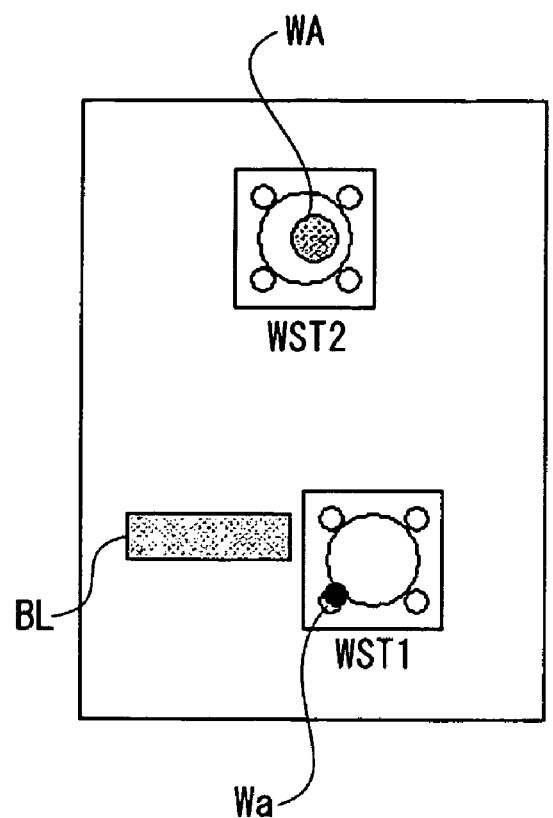
FIG. 10 is a top view of the wafer stage of the immersion exposure apparatus illustrated in FIG. 1 with residual water on the reference mark unit illustrated in FIG. 8.
Figure 11:
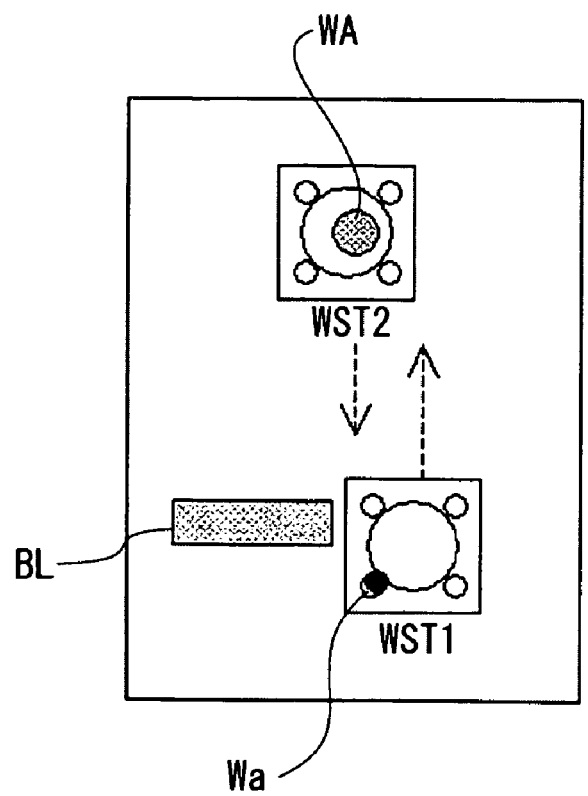
FIG. 11 is a top view of the wafer stage of the immersion exposure apparatus illustrated in FIG. 1 with residual water on the reference mark unit illustrated in FIG. 8.
Figure 12:
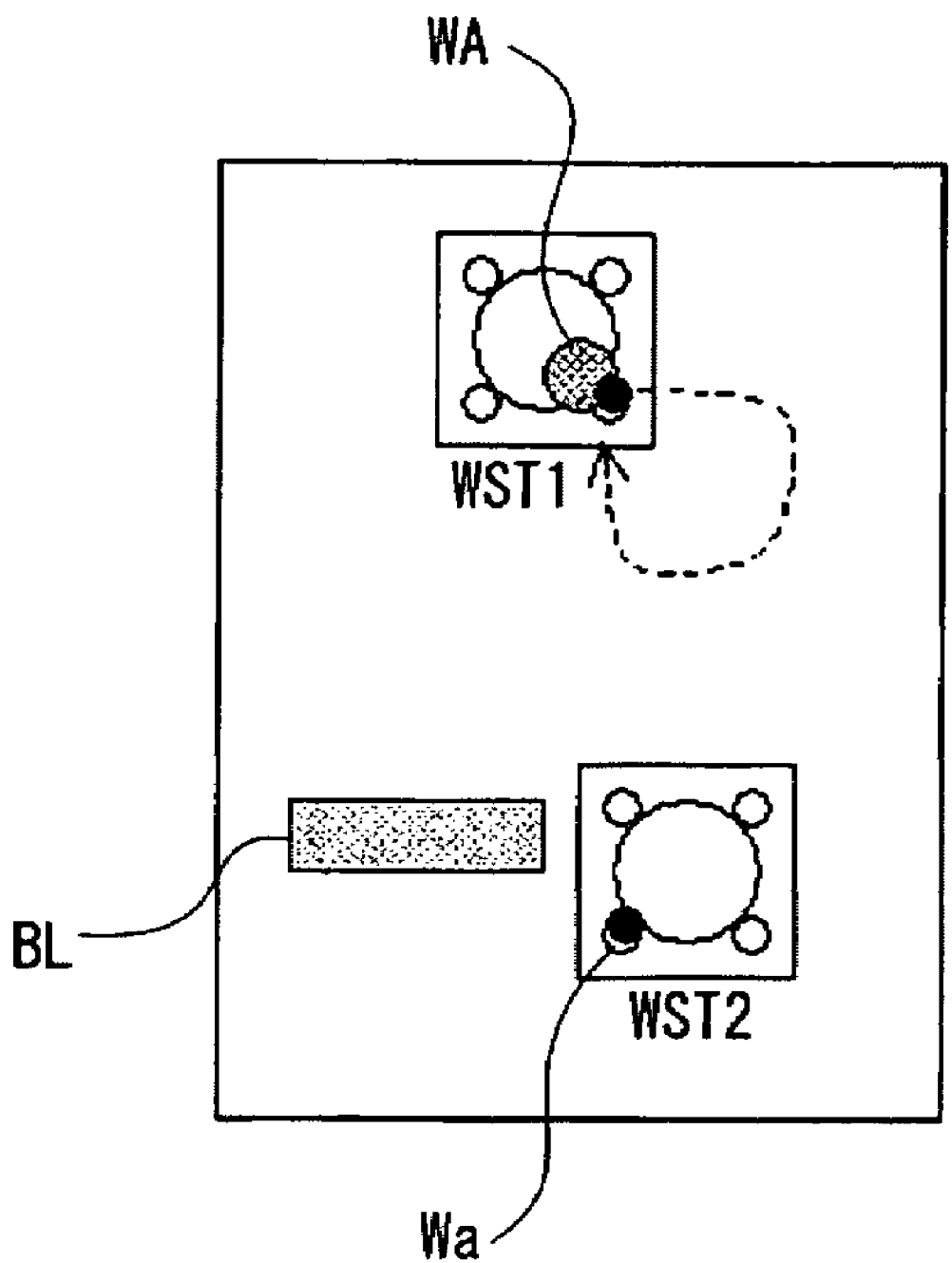
FIG. 12 is a top view of the wafer stage of the immersion exposure apparatus illustrated in FIG. 1 with residual water on the reference mark unit illustrated in FIG. 8.

FIG. 10 illustrates a case where the residual water Wa on the reference mark unit FM remains without contacting the liquid from the immersion unit WA for more than drying time of the residual water when the apparatus is in a idle state and the wafer stage WST1 stays in the measurement area AL. In such a case, the stage swap is performed as illustrated in FIG. 11 and the wafer stage WST1 is moved to the exposure area EXPO. As illustrated in FIG. 12, the wafer stage WST1 is moved so that the reference mark unit FM contacts the liquid from the immersion unit WA.

Similarly, in the exposure area EXPO, if a time the reference mark unit FM does not contact the liquid from the immersion unit WA exceeds the drying time, the wafer stage WST1 is moved as illustrated by a dotted line in FIG. 12 so that the reference mark unit FM contacts the liquid from the immersion unit WA.

When the reference mark unit FM contacts the liquid, the residual water Wa on the reference mark unit FM can be prevented from drying. Thus, generation of a watermark is prevented and time for drying the residual water Wa on the reference mark unit FM or removing the liquid during the exposure process becomes unnecessary. Accordingly, throughput of the exposure apparatus can be improved. Although the reference mark unit FM is prevented from drying by contacting the liquid from the immersion unit WA according to the present exemplary embodiment, the reference mark unit FM or the top surface thereof may be immersed with liquid supplied from a supply port of a different liquid supply unit to wet.

Figure 13:
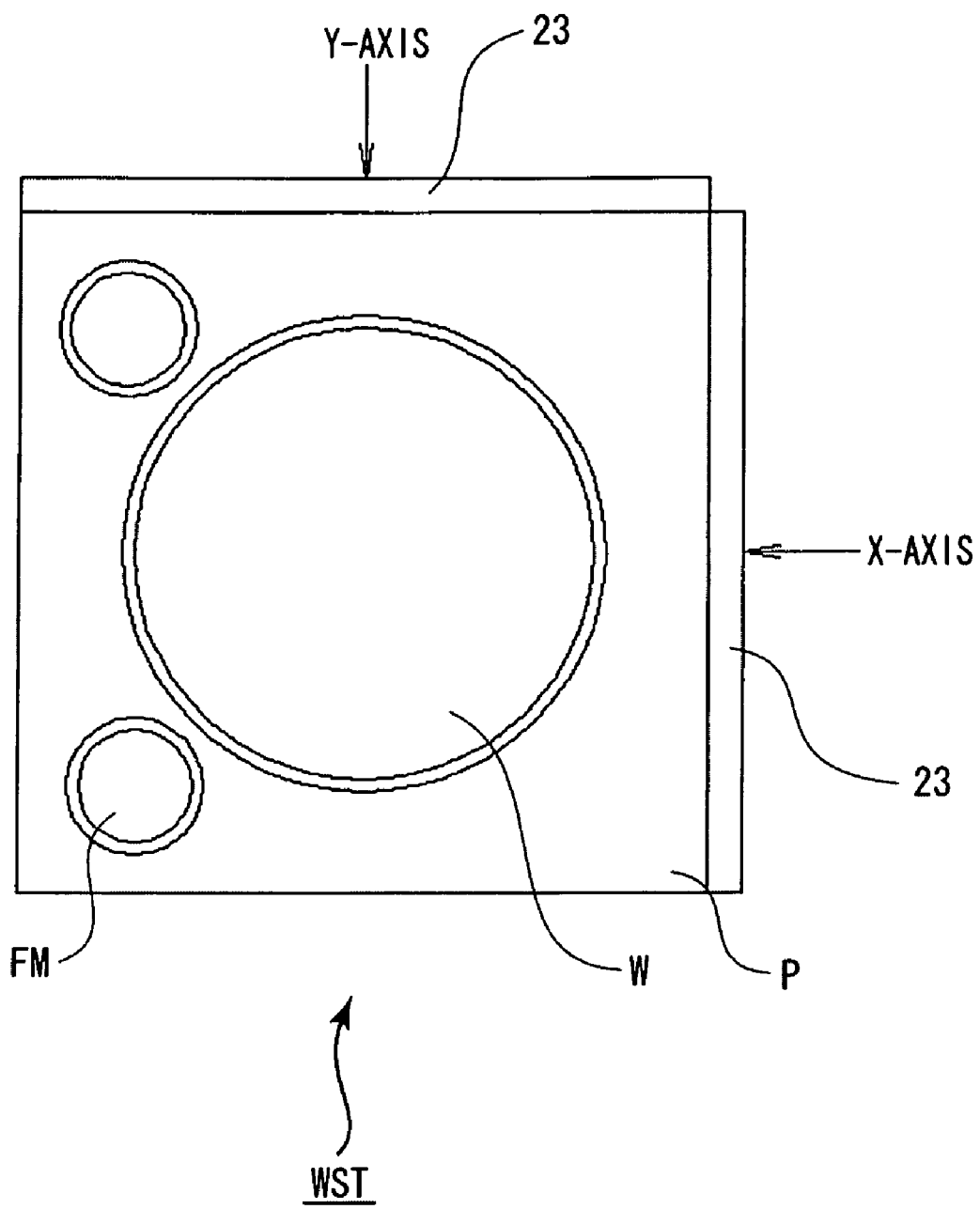
FIG. 13 is a top view of a single wafer stage of the immersion exposure apparatus illustrated in FIG. 1.
Figure 14:
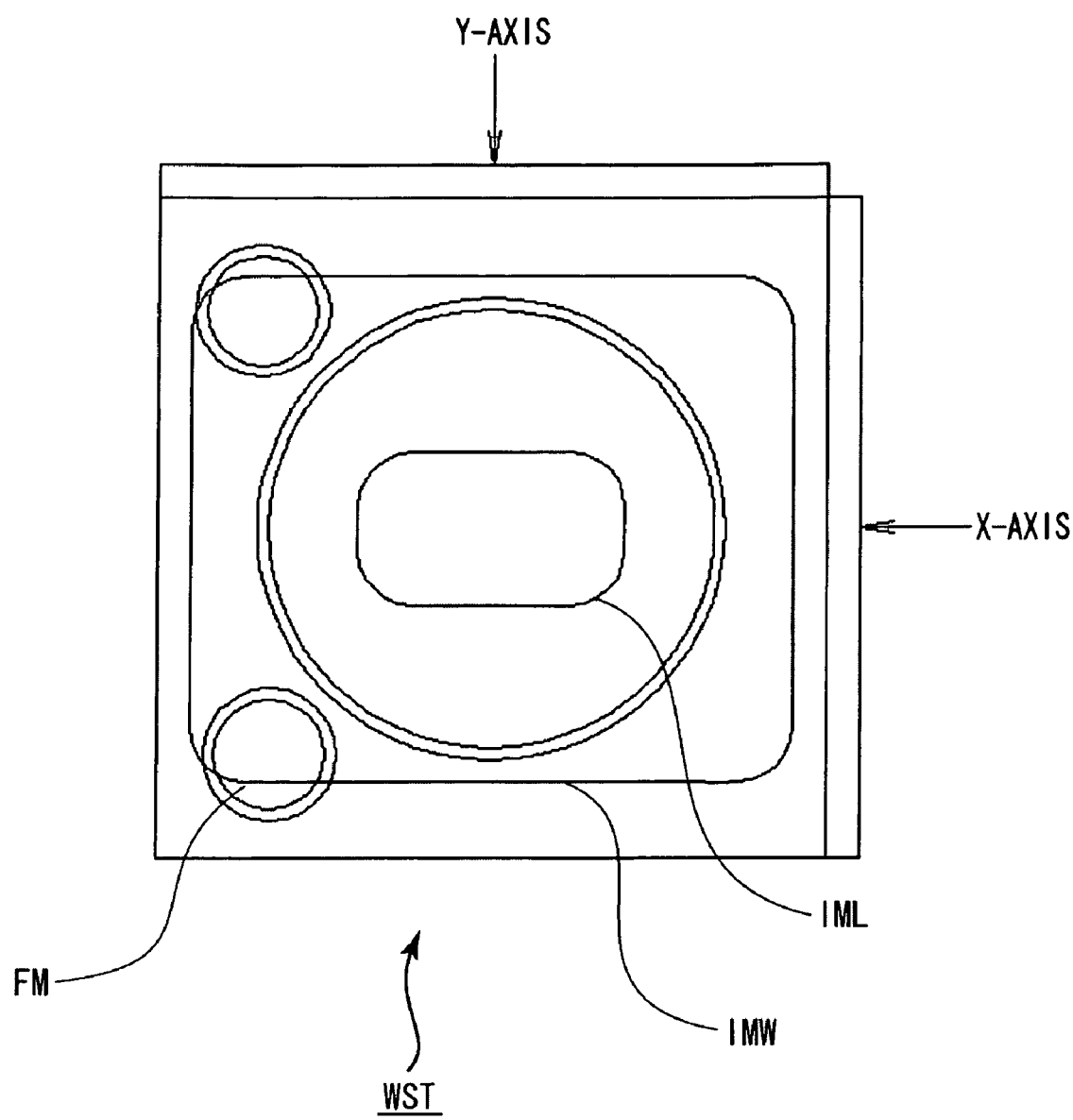
FIG. 14 illustrates an immersion area on the wafer stage illustrated in FIG. 13.

FIG. 13 is a top view of the wafer stage WST. FIG. 14 illustrates an immersion area IML and an area IMW superimposed on the wafer stage WST illustrated in FIG. 13. The liquid from the immersion area IML contacts the area IMW during exposure of the wafer W. As illustrated in FIG. 14, since the reference mark unit FM is arranged in a vicinity of the wafer W, the reference mark unit FM contacts the area IMW during exposure of the wafer W. In other words, the reference mark unit FM contacts the liquid.

Figure 15:
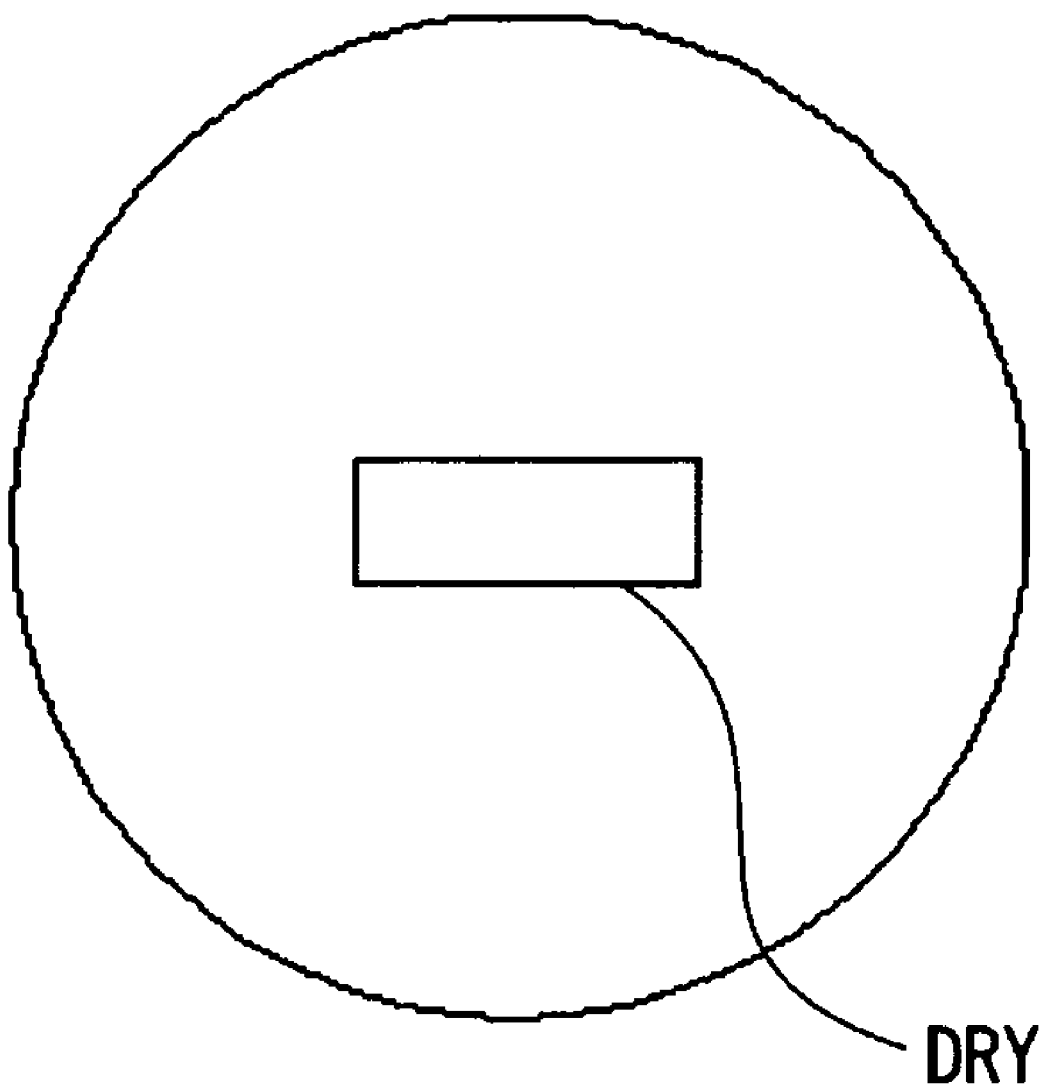
FIG. 15 illustrates a water repellent area on the reference mark unit.
Figure 16A:
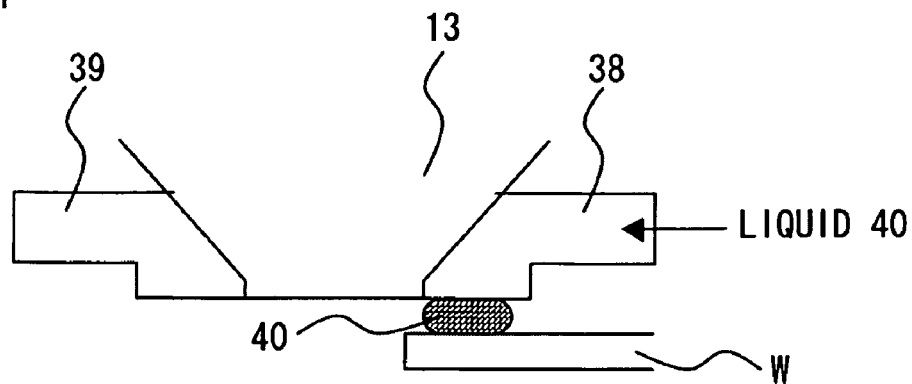
FIGS. 16A through 16C illustrate an immersion nozzle unit of a conventional immersion exposure apparatus.
Figure 16B:
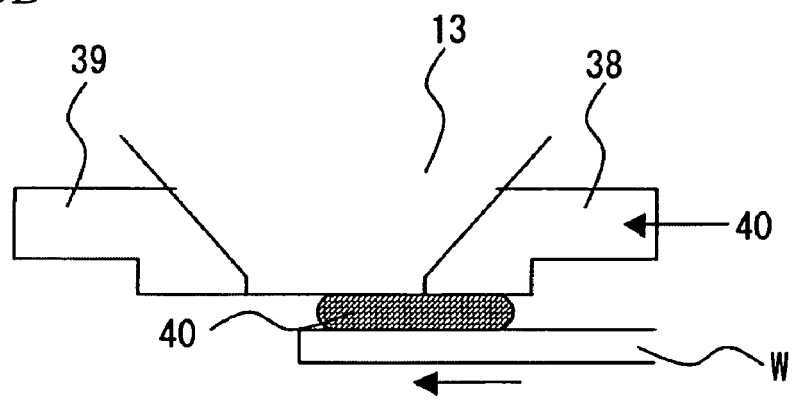
Figure 16C:
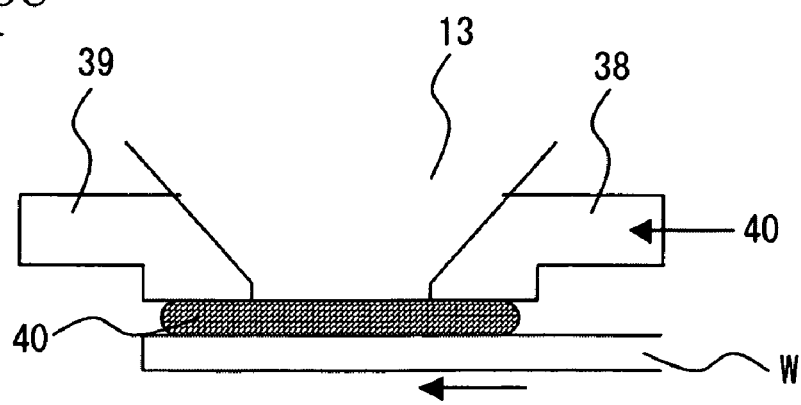

FIG. 15 is a top view of the reference mark on the reference mark unit FM. A rectangular area DRY is not coated with a water-repellent coating. A measurement mark (not shown) which uses the exposure light as detection light or an opening (not shown) is provided in the area DRY. When the reference mark passes the immersion area, since the inner area of the area DRY is hydrophilic and the outer side is water-repellent, water remains in the area DRY. If the residual water does not affect measurement of the reference mark by the alignment sensor 16 or the detection system 18 in the measurement area, the residual water is not necessarily removed.

However, if the apparatus is stopped for a certain period of time, the residual water is air-dried and a watermark may be generated. Thus, if the apparatus is stopped for a time longer than an air drying time of the residual water, it is effective to remove the residual water by the residual water removing mechanism or maintain the area DRY in a wet state.

The air drying time is substantially determined by humidity in a space where the wafer stage WST is located, and an amount of residual water. The amount of residual water is substantially determined by a contact angle of the water repellent coating with the liquid, and size of the area DRY. The contact angle of the water repellent coating depends on the water repellent coating. If a plurality of reference mark units FM are formed on the wafer stage WST, whether to remove the residual water or wet the area DRY is determined based on a minimum air drying time of the reference mark units FM.

If the wet state of the reference mark unit FM is continued during the exposure operation, the residual water will not be removed or the area DRY will not be wet. The residual water is removed or the area DRY is wetted only when the apparatus is stopped for a time longer than the air drying time of the residual water. Thus, a watermark is prevented from forming on the reference mark unit FM or on the measurement unit without decreasing productivity of the exposure apparatus.

Figure 17:
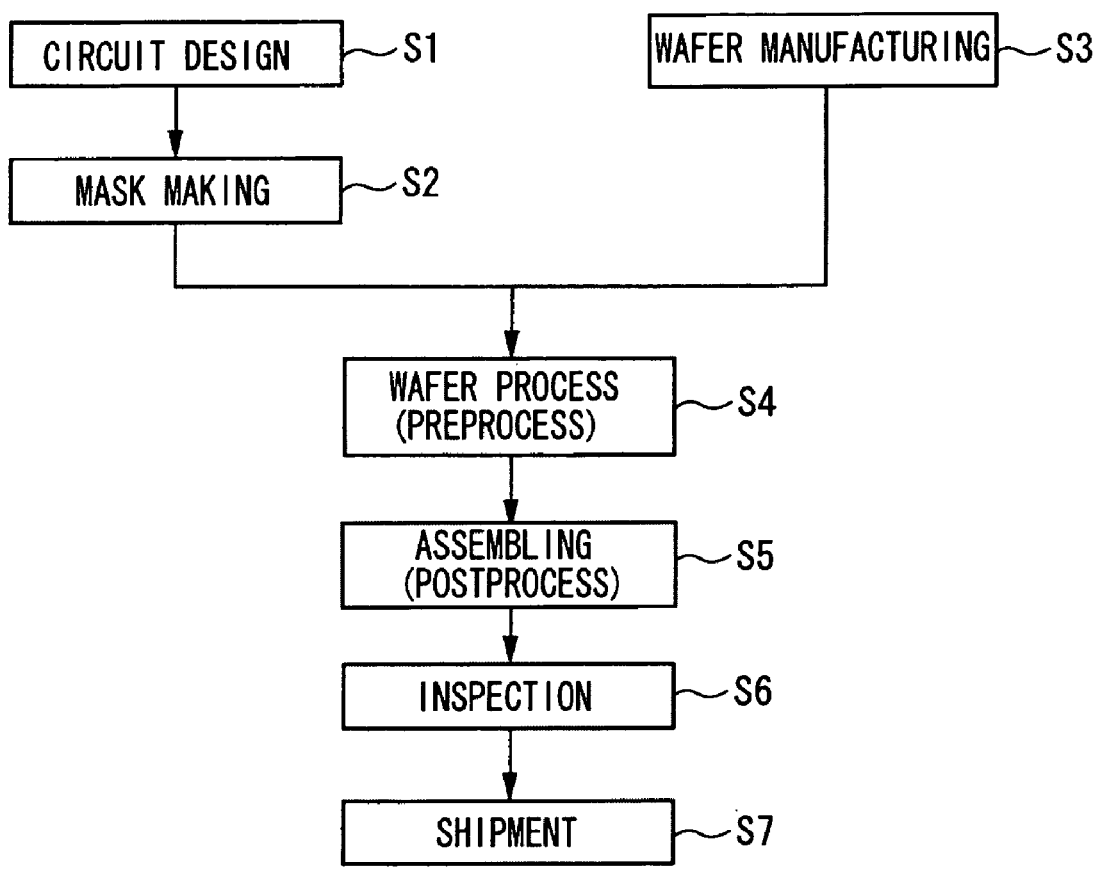
FIG. 17 is a flowchart illustrating exemplary manufacturing processes for a semiconductor device using the exposure apparatus.

Next, referring to FIGS. 17 and 18, a device manufacturing method using the above-described exposure apparatus will be described. FIG. 17 is a flowchart illustrating exemplary manufacturing processes for a device (a semiconductor chip such as an integrated circuit (IC) and a large scale integration (LSI), a liquid crystal display (LCD), and a charge-coupled device (CCD)). Manufacturing processes for a semiconductor chip is taken as an example in FIG. 17.

Step S1 is a process for designing a circuit of a semiconductor device. Step S2 is a mask making process for fabricating a mask, which can be referred to as an original plate or a reticle, based on a designed circuit pattern. Step S3 is a process for manufacturing a wafer, which can be referred to as a substrate, by using a silicon or comparable material. Step S4 is a wafer process, which can be referred to as "preprocess", for forming an actual circuit on a wafer with the prepared mask by above-described exposure apparatus using a lithography technique. Step S5 is an assembling process, which can be referred to as "postprocess", for forming a semiconductor chip using the wafer manufactured in step S4. The postprocess includes an assembly process (dicing, bonding, etc.) and a packaging process (chip sealing). Step S6 is a process for inspecting the semiconductor device manufactured in step S5. The inspection includes an operation confirmation test and an endurance test. Step S7 is a process for shipping the semiconductor device completed through the above-described processes.

Figure 18:
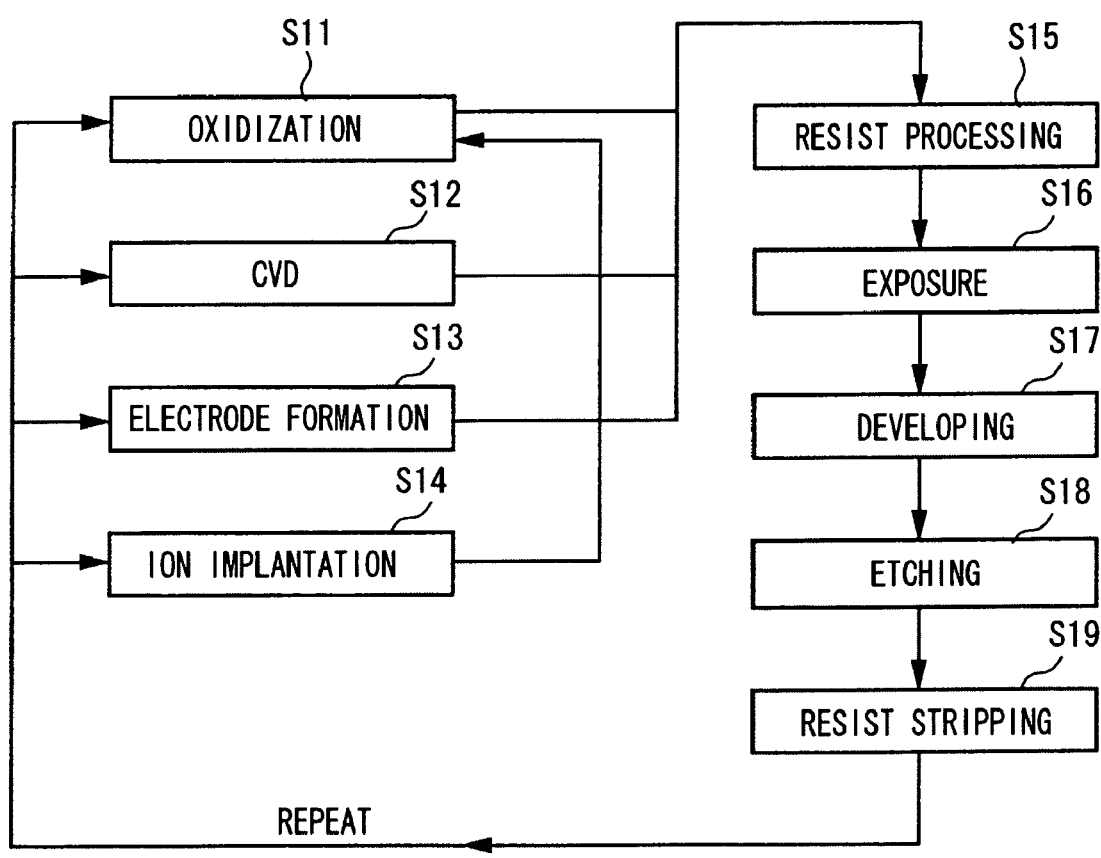
FIG. 18 is a detailed flowchart of a wafer process in step S4 included in FIG. 17.

As illustrated in FIG. 18, the above-described wafer process in step S4 includes an oxidation step S11 for oxidizing a wafer surface, a chemical vapor deposition (CVD) step S12 for forming an insulating film on the wafer surface, and an electrode formation step S13 for forming electrodes on the wafer by vaporization. Furthermore, the wafer process in step S4 includes an ion implantation step S14 for implanting ions into the wafer, a resist processing step S15 for applying the wafer with a photosensitive material, and an exposure step S16 for exposing the wafer with light to transfer the circuit pattern of the mask using the above-described exposure apparatus. Furthermore, the wafer process in step S4 includes a developing step S17 for developing the wafer exposed in the exposure step S16, an etching step S18 for cutting a portion other than a resist image developed in the developing step S17, and a resist stripping step S19 for removing an unnecessary resist remaining after the etching step S18. By repeating the above-described steps, multiple circuit patterns can be formed on a wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-172453 filed Jun. 29, 2007, which is hereby incorporated by reference herein in its entirety.

What is claimed is:

1. An exposure apparatus configured to project a pattern formed on an original plate onto a substrate through a projection optical system and liquid in a state where a gap between the substrate and a face of the projection optical system is filled with liquid, the apparatus comprising:
   a movable substrate stage configured to hold the substrate and including at least one of a mark unit and a measurement unit having a light-receiving unit;
   a determination device configured to determine whether liquid is attached to at least one of the mark unit and the measurement unit; and
   a liquid supply device configured to attach liquid to at least one of the mark unit and the measurement unit before liquid on at least one least one of the mark unit and the measurement unit is air-dried if the determination device determines that liquid is attached to at least one of the mark unit and the measurement unit.

2. The exposure apparatus according to claim 1, wherein the liquid supply device attaches liquid by supplying additional liquid to the at least one of the mark unit and the measurement unit so as to maintain the at least one of the mark unit and the measurement unit in a wet state.

3. The exposure apparatus according to claim 1, wherein the mark unit includes a reference mark used as a reference in aligning the original plate and the substrate.

4. The exposure apparatus according to claim 1, wherein the measurement unit includes a light-receiving unit configured to measure an amount of exposure on the substrate, or a mark and a light-receiving unit configured to measure an image forming performance of the projection optical system or a focus position.

5. The exposure apparatus according to claim 1, wherein the liquid supply device includes a first liquid supply unit configured to supply the liquid into a gap between the substrate and the final face of the projection optical system and a second liquid supply unit configured to supply the liquid to at least one of the mark unit and the measurement unit aside from the first liquid supply unit.

6. The exposure apparatus according to claim 1, wherein a portion of at least one of the mark unit and the measurement unit has water repellency to the liquid.

7. The exposure apparatus according to claim 6, wherein the determination device determines whether the liquid is attached based on a determination whether the portion of at least one of the mark unit and the measurement unit which does not have water repellency to the liquid has contacted the liquid.

8. The exposure apparatus according to claim 6, wherein the portion having water repellency is an area which is not irradiated with exposure light during measurement, and
   wherein the exposure apparatus further includes a liquid removing mechanism configured to remove the liquid attached to a portion not having water repellency other than the portion having water repellency.

9. The exposure apparatus according to claim 8, wherein the liquid removing mechanism removes the liquid attached to at least one of the mark unit and the measurement unit when the exposure apparatus is stopped.

10. The exposure apparatus according to claim 8, wherein the liquid removing mechanism removes the liquid attached to at least one of the mark unit and the measurement unit when the mark unit or the measurement unit is used in a dry state.

11. The exposure apparatus according to claim 8, wherein the liquid removing mechanism removes the liquid attached to at least one of the mark unit and the measurement unit by blowing gas to the liquid.

12. The exposure apparatus according to claim 1, further comprising:
   an exposure area targeted in an exposure operation;
   a measurement area targeted in measuring a position of the substrate, and
   a first substrate stage and a second substrate stage as the substrate stage;
   wherein the first substrate stage is swapped with the second substrate stage and carry-in of the substrate, position measurement, substrate exposure, and carry-out of the substrate are performed.

13. The exposure apparatus according to claim 12, wherein at least one of the mark unit and the measurement unit includes, on the first substrate stage and the second substrate stage, either single or plurality of plates arranged at a height substantially same as the substrate, or single or plurality of interferometer reflection mirrors configured to measure a position of the substrate stage.

14. A method for projecting a pattern formed on an original plate onto a substrate through a projection optical system and liquid in a state where the substrate is mounted onto a movable substrate stage including at least one of a mark unit and a measurement unit and a gap between the substrate and a face of the projection optical system is filled with liquid, the method comprising:
   determining whether liquid is attached to at least one of the mark unit and the measurement unit, and
   attaching liquid to at least one of the mark unit and the measurement unit before liquid on at least one of the mark unit and the measurement unit is air-dried if liquid is determined to be attached to at least one of the mark unit and the measurement unit.

15. The method according to claim 14, wherein attaching liquid comprises supplying additional liquid to at least one of the mark unit and the measurement unit so as to maintain at least one of the mark unit and the measurement unit in a wet state.

16. A method for manufacturing a device, comprising exposing a substrate to light using the exposure apparatus according to claim 1, and developing the exposed substrate.

* * * * *